United States Patent [19]

Schueller

[11] Patent Number: 5,585,162
[45] Date of Patent: Dec. 17, 1996

[54] GROUND PLANE ROUTING

[75] Inventor: Randolph D. Schueller, Austin, Tex.

[73] Assignee: Minnesota Mining and Manufacturing Company, St. Paul, Minn.

[21] Appl. No.: 491,120

[22] Filed: Jun. 16, 1995

[51] Int. Cl.$^6$ ........................................................ B32B 9/00
[52] U.S. Cl. ........................... 428/131; 428/209; 428/901; 439/81; 439/82; 439/83; 439/84; 361/749; 361/751; 361/767
[58] Field of Search ..................................... 428/209, 131; 439/81, 82, 83, 84; 361/749, 751, 767

[56] References Cited

U.S. PATENT DOCUMENTS 3,148,310  9/1964  Feldman .................................... 439/83
3,537,176  11/1970  Healy et al. ............................ 361/749

*Primary Examiner*—Patrick Ryan
*Attorney, Agent, or Firm*—Gary L. Griswold; Walter N. Kirn; Andrew J. Dillon

[57] ABSTRACT

A flexible circuit construction allows solder balls to be mass reflow attached to the ground plane of a double-sided flexible circuit by providing a first via which is separate from the remainder of the ground plane, but which is electrically connected to the ground plane through a second via at a distance from the first via by a circuit trace on the side of the flexible circuit opposite the ground plane.

4 Claims, 3 Drawing Sheets

GROUND PLANE ROUTING

FIELD OF THE INVENTION

The present invention relates generally to flexible circuits and, more particularly, to flexible circuits to which an array of solder spheres are attached to form a ball grid array package for integrated circuits.

BACKGROUND OF THE INVENTION

The ability to place solder balls onto vias on a double-sided flexible substrate and mass reflow these solder balls in a conveyor oven would be a rapid and low cost method of attaching the solder balls to the substrate. This procedure, however, is not currently possible since many of the vias are connected directly to the ground plane and so when a solder ball is placed onto the via and heated, it collapses and spills from the via onto the ground plane. The current procedure for attaching solder balls to double-sided metal circuitry is to weld the solder balls onto the vias one at a time with controlled pulse heating. This method produces good results but is slow and costly. Another method is to selectively deposit a solder mask onto the ground plane before mass reflow to prevent spilling of solder at ground plane vias. However, this method adds a process step and is also costly.

SUMMARY OF THE INVENTION

The present invention allows mass reflow connection of solder balls to metallized vias on a two metal layer flexible substrate (such as polyimide) by preventing collapse of the solder ball. In this construction, a polyimide window is created around each via on the ground plane side of the substrate. This window acts as a solder dam which prevents collapse of the solder ball. In instances where the solder ball needs to be electrically connected to the ground plane, this is done by routing from the solder ball via to the circuit side and back down to the ground plane through another via located at a distance from the solder ball. This design can be carried out with either through hole or blind vias.

This design allows attachment of solder balls to flexible circuitry by the more efficient and less costly process of mass reflow. For example, solder balls can be placed in position on the flexible circuitry and held in place with a sticky flux as the circuit passes through a conveyor oven to reflow the solder and attach the balls. The flexible circuitry can then be soldered to the circuit board using standard processes known in the surface mount industry.

In general terms the invention is a flexible circuit structure capable of mass reflow attachment of solder balls to a ground plane thereof including a flexible polymeric base having two major surfaces, a first metal coating defining a ground plane disposed on one major surface of the base, a second metal coating defining circuit traces on the other major surface of the base, a clear area on the first major surface free of the first metal coating and sufficiently large so as to accept a solder ball disposed therein without contact between the first metal coating and the solder ball, a hole in the clear area through the base and communicating with the second metal coating; a via connecting the first and the second metal coatings through the base and removed from the clear area, and a circuit trace of the second metal coating extending from the hole to the via. This construction allows a solder ball placed in the hole to be mass reflow attached to the second metal coating through the hole while remaining free of direct physical contact with the first metal surface, but while being in electrical contact with the first metal coating through the circuit trace extending from the hole to the via and then through the via.

In more particular terms, the preferred embodiment of the invention is a flexible circuit structure capable of mass reflow attachment of solder balls to a ground plane thereof and includes a flexible, polymeric base; a first conductive coating defining a ground plane disposed on one side of the base; a second conductive coating defining circuit traces on the other side of the base; a first via connecting the first conductive coating and the second conductive coating; a second via connecting the first conductive coating and the second conductive coating, the second via being removed from the first via; an area completely surrounding the first via free of the first conductive coating; a circuit trace defined by the second conductive coating electrically connected to the first via and leading to the second via. By means of this construction, a solder ball placed in the first via on the first conductive coating of the flexible circuit may be mass reflow soldered to the first via while remaining free of physical contact with the first conductive surface surrounding the first via, but while remaining in electrical contact with the first conductive surface surrounding the first via through the circuit trace and the second via.

BRIEF DESCRIPTION OF THE DRAWINGS

The present invention will be described with respect to the accompanying drawings, wherein like numbers refer to like parts in the several views, and wherein.

DESCRIPTION OF THE PREFERRED EMBODIMENT

Figure 1:
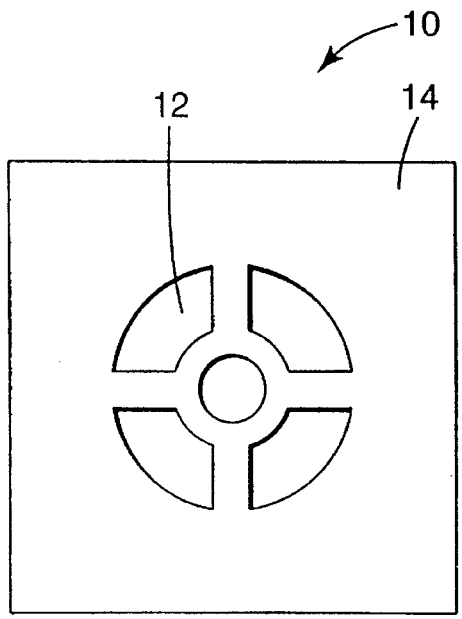
FIG. 1 is a plan view of a portion of a flexible circuit according to the prior art illustrating a via connected to the ground plane.
Figure 2:
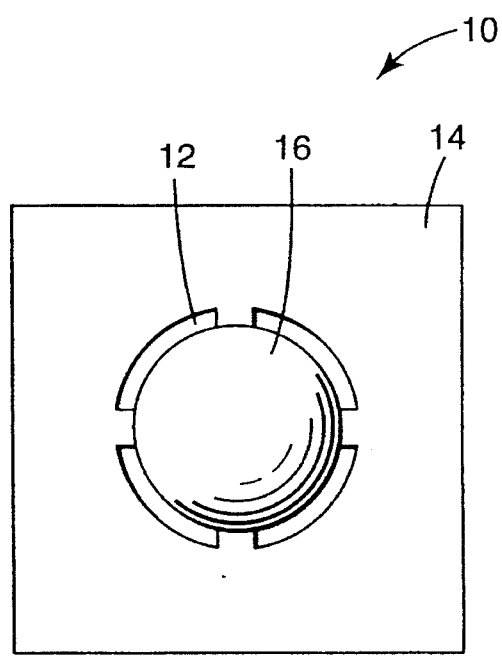
FIG. 2 is a view similar to that of FIG. 1 with a solder ball placed on the via.
Figure 3:
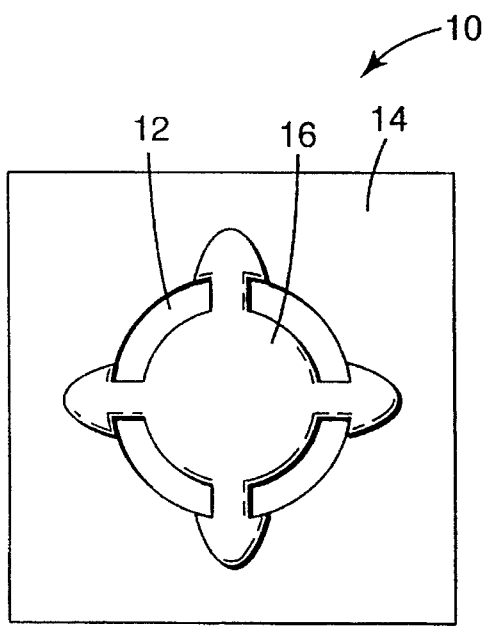
FIG. 3 is a view similar to those of FIGS. 1 and 2 after mass reflow of the solder ball.

FIGS. 1 through 3 illustrate an attempt to mass reflow solder a solder ball to the ground plane of a flexible circuit by conventional means. In these Figures, a portion of a conventional flexible circuit, generally indicated as 10, is illustrated. The flexible circuit 10 includes a polymeric, usually polyimide, central base lamination 12, a first conductive coating usually of metal, and preferably copper, on one side of the base 12 and defining a ground plane 14 and a second coating (not shown) of metal on the opposite side of the base 12 defining circuit traces. To attempt to mass reflow a solder ball 16 to this ground plane 14, as large an area as practical of the ground plane 14 is removed in an attempt to prevent unwanted flow of the solder ball 16, leaving a conductive circle 15 which is electrically coupled to ground plane 14 via multiple connecting traces 17. Unfortunately, FIG. 3 illustrates that upon heating the solder ball 16 does not remain in the desired central location, but rather collapses and flows along the connecting traces 17 to the ground plane 14 to flood the ground plane 14. It will be noted that the collapsed solder ball 16 does not wet the polyimide base 12 very well, and flows around the exposed base 12 portions.

Figure 4:
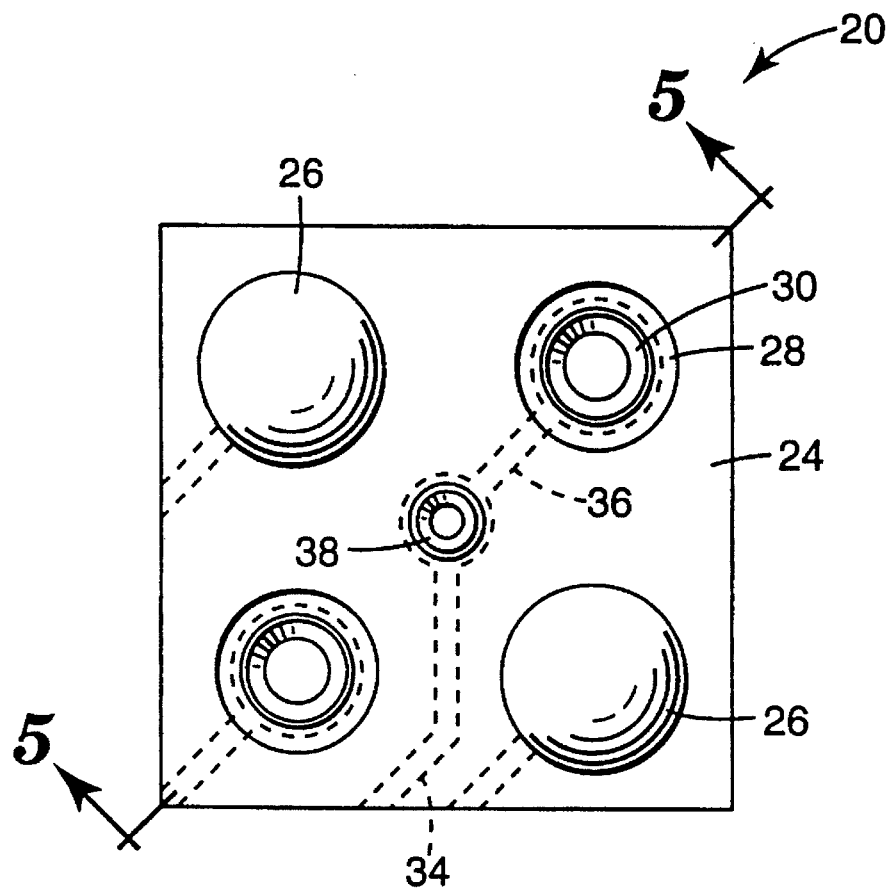
FIG. 4 is a plan view of the ground plane side of a flexible circuit according to the present invention.
Figure 5:
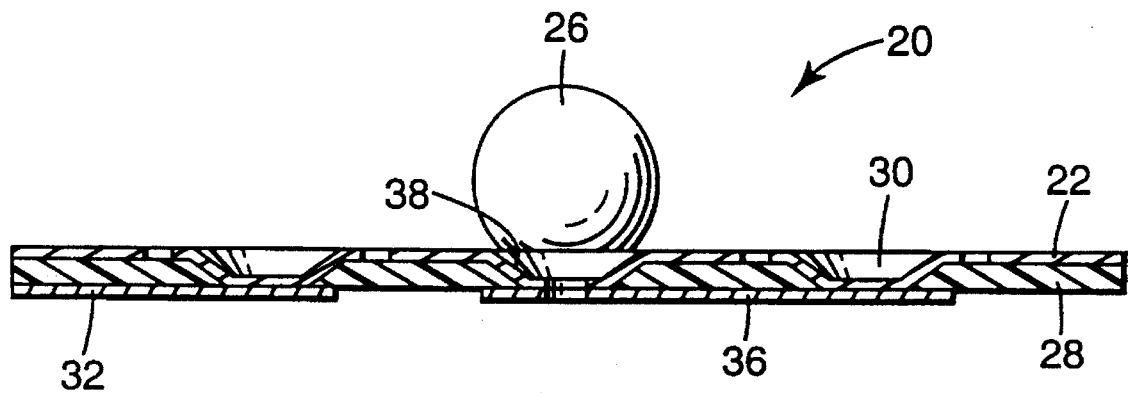
FIG. 5 is a cross-sectional view of the flexible circuit of FIG. 4 taken generally along the line 5—5 of FIG. 4.
Figure 6:
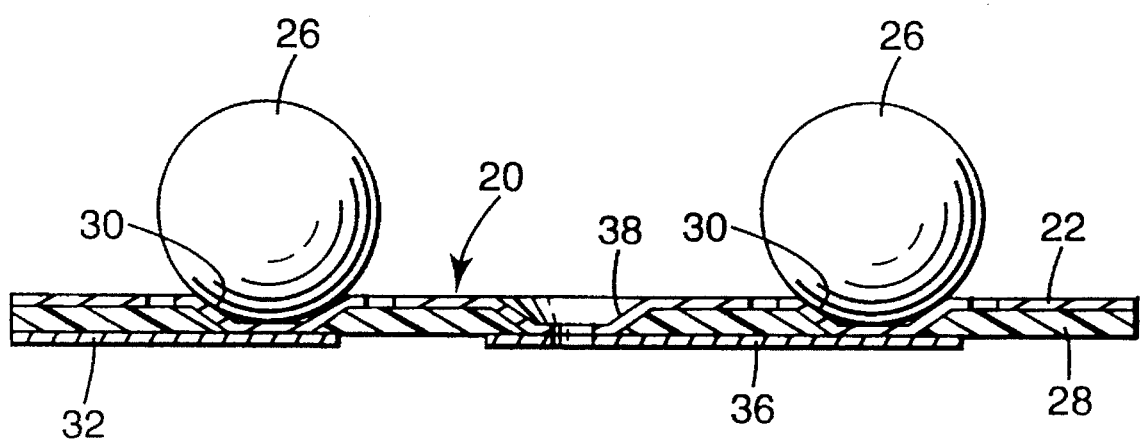
FIG. 6 is a view similar to that of FIG. 5 with solder balls in place.

FIGS. 4 through 6 illustrate an improved construction of a flexible circuit 20 according to the present invention which allows solder balls to be mass reflow soldered to the ground plane 22 without collapsing and flooding the ground plane 22. At locations such as 24 where it is desired to attach a solder ball 26, an entire circular disk of the first metal coating defining the ground plane 22 is removed (or not deposited in the first instance) to expose the polyimide base lamination 28. Within the exposed area of the base 28, a via 30 is constructed which connects to the second coating of metal on the side of the base 28 which define individual circuit traces 34. Those familiar with flexible circuit 20 construction methods will recognize that the above description is presented for conceptual purposes only. In actuality, the via 30 will be formed along with the ground plane 22 by the application of the first metal coating to the polyimide base 28, and an annular portion around the via 30 will be masked to prevent coating of the base in this area surrounding where the grounded solder ball 26 is desired.

On the circuit trace 34 side of the base 28, is a circuit trace 36 which leads to a second via 38 which connects the first metal coating constituting the ground plane 22 to the second metal coating constituting the circuit traces 34 through the polyimide base 28 at a position removed from the via 30 at which the solder ball 26 is located. With this arrangement, the solder ball 26 remains free of direct contact with the ground plane 22, but is maintained in electrical contact with the ground plane 22 through the vias 30 and 38 and the circuit trace 36 connecting the two.

Since the solder ball 26 is free of direct contact with the ground plane 22 by virtue of the fact that the solder ball 26 is completely surrounded by an annular area of the polyimide base 28, the solder ball 26 will not wet the polyimide of the surrounding base 28 and so will not flow along the ground plane 22 as described with respect to the prior art of FIGS. 1 through 3. Thus the solder ball 26 will maintain its shape even though subjected to the temperatures required for mass reflow attachment of the solder ball 26 to the flexible circuit 20.

Figure 7:
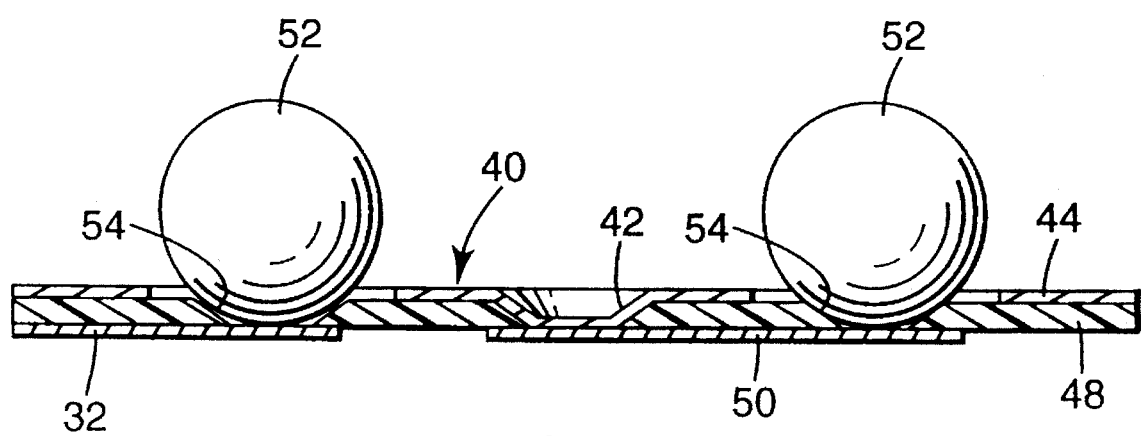
FIG. 7 is a cross-sectional view similar to FIG. 6 of an alternate embodiment of a flexible circuit according to the invention.

FIG. 7 illustrates an alternate embodiment of a flexible circuit 40 which shows two ways the flexible circuit 20 of FIGS. 4 through 6 could be changed and still retain the function described above. The via 42 could be a "blind" via in that the two metal coatings 44 and 46 are in contact through the polyimide base 48 as above, but there is no through-hole as previously illustrated. Also, the via 50 to which the solder ball 52 is attached need not be provided with the first surface coating as illustrated in the previous Figures. As shown, the polyimide base 48 could simply be provided with a through-hole 54 formed by such means as punching, chemical etching or laser drilling which is large enough to allow the solder ball 52 to contact the second coating 46 defining the circuit traces.

Thus there has been described a flexible circuit construction which permits the mass reflow attachment of solder balls to the ground plane of a double-sided flexible circuit while preventing the collapse of the solder ball and flow of the solder ball along the ground plane. Although the invention has been described with respect to only a limited number of embodiments, many changes will be apparent to those skilled in the art. For example, multiple solder balls may be connected to a single distant via connecting the first conductive surface and the second conductive surface. In addition, the clear areas around the solder balls need not be circular as shown but rather could be any shape so long as the solder balls are free of contact with the first conductive surface.

The invention claimed is:

1. A flexible circuit structure capable of mass reflow attachment of solder balls to a ground plane thereof, the flexible circuit structure comprising:

a flexible polymeric base having two major surfaces;

a first metal coating disposed on one major surface of said base;

a second metal coating defining circuit traces on the other major surface of said base;

a clear area on said first major surface free of said first metal coating and sufficiently large so as to accept a solder ball disposed therein without contact between said first metal coating and said solder ball;

a hole in said clear area through said base and communicating with said second metal coating;

a via connecting said first and said second metal coatings through said base and physically removed from said clear area;

a circuit trace of said second metal coating extending from said hole to said via;

so that a solder ball placed inn said hole may be mass reflow attached to said second metal coating through said hole while remaining free of direct physical contact with said first metal surface, but while being in electrical contact with said first metal coating through said circuit trace extending from said hole to said via and through said via.

2. A flexible circuit structure according to claim 1 wherein said via is a through via in that a hole extends through said first metal coating, said second metal coating and said base at said via.

3. A flexible circuit structure capable of mass reflow attachment of solder balls to a ground plane thereof, the flexible circuit structure comprising:

a flexible, polymeric base;

a first conductive coating defining a ground plane disposed on one side of said base;

a second conductive coating defining circuit traces on the other side of said base;

a first via connecting said first conductive coating and said second conductive coating;

a second via connecting said first conductive coating and said second conductive coating, said second via being physically removed from said first via;

an area completely surrounding said first via free of said first conductive coating; and a circuit trace defined by said second conductive coating electrically connected to said first via and leading to said second via;

so that a solder ball may be placed in said first via on said first conductive coating of said flexible circuit and mass reflow soldered to said first via while remaining free of physical contact with said first conductive surface surrounding said first via, but while remaining in electrical contact with said first conductive surface surrounding said first via through said circuit trace and said second via.

4. A flexible circuit structure according to claim 3 wherein said second via is a through via in that a hole extends through said first conductive coating, said second conductive coating and said base at said second via.

* * * * *